(12) United States Patent
Jin et al.

(10) Patent No.: US 12,328,904 B2
(45) Date of Patent: Jun. 10, 2025

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Abraham Yoo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 547 days.

(21) Appl. No.: 17/712,498

(22) Filed: Apr. 4, 2022

(65) Prior Publication Data
US 2022/0328642 A1    Oct. 13, 2022

(30) Foreign Application Priority Data
Apr. 7, 2021    (CN) .......................... 202110373963.6

(51) Int. Cl.
*H01L 21/84*     (2006.01)
*H01L 21/762*    (2006.01)
(Continued)

(52) U.S. Cl.
CPC ..... *H10D 30/6735* (2025.01); *H10D 30/6757* (2025.01); *H10D 62/118* (2025.01);
(Continued)

(58) Field of Classification Search
CPC ......... H01L 21/823878; H01L 29/0653; H01L 27/092; H10D 30/6757; H10D 30/6735; H10D 62/121
See application file for complete search history.

(56) References Cited

U.S. PATENT DOCUMENTS 11,164,942 B1 * 11/2021 Weckx .............. H01L 21/31111
2021/0376076 A1 * 12/2021 Su ..................... H01L 21/76897

\* cited by examiner

*Primary Examiner* — John A Bodnar
(74) *Attorney, Agent, or Firm* — Crowell & Moring LLP

(57) ABSTRACT

A semiconductor structure and a method for forming the same are provided. In one form, a semiconductor structure includes: a substrate and protruding portions protruding from the substrate in sub-device regions; channel structure layers located on the protruding portions and spaced apart from the protruding portions, where each of the channel structure layers includes one or more channel layers spaced apart from each other; a dielectric wall located on the substrate between adjacent sub-device regions in a longitudinal direction, where the dielectric wall includes a main dielectric wall portion protruding from the substrate and dielectric wall protrusions protruding from the main dielectric wall portion in the longitudinal direction, where the dielectric wall protrusions are in contact with side walls of the channel layers; gate structures located on the sub-device regions, spanning tops of the channel structure layers in the sub-device regions, and surrounding the channel layers exposed from the dielectric wall; and source/drain doped layers located on the protruding portions on two sides of the gate structures and in contact with the channel structure layers. In forms of the present disclosure, an influence of the dielectric wall on a stress applied by the source/drain doped layers to the channel layers is reduced, and performance of the semiconductor structure is optimized.

10 Claims, 7 Drawing Sheets

(51) Int. Cl.
*H01L 27/12* (2006.01)
*H01L 29/423* (2006.01)
*H10D 30/67* (2025.01)
*H10D 62/10* (2025.01)
*H10D 64/01* (2025.01)
*H10D 84/01* (2025.01)
*H10D 84/03* (2025.01)
*H10D 84/85* (2025.01)

(52) U.S. Cl.
CPC ......... *H10D 64/017* (2025.01); *H10D 84/017* (2025.01); *H10D 84/038* (2025.01); *H10D 84/85* (2025.01)

SEMICONDUCTOR STRUCTURE AND FORMING METHOD THEREOF

RELATED APPLICATIONS

The present application claims priority to Chinese Patent Appln. No. 202110373963.6, filed Apr. 7, 2021, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the rapid development of semiconductor manufacturing technologies, semiconductor transistors have developed toward higher element density and higher integration, and a developing trend of semiconductor process nodes according to the Moore's Law continuously weakens. Transistors are currently being widely used as the most basic semiconductor transistors. Therefore, as the element density and integration of the semiconductor transistors increase, channel lengths of the transistors need to be continuously shortened to adapt to reduced process nodes.

To better meet a requirement of proportional reduction in a transistor size, the semiconductor process gradually transits from a planar transistor to a three-dimensional transistor with higher efficacy, such as a fin field effect transistor (FinFET) or a gate-all-around (GAA) transistor. The GAA transistor includes a vertical GAA transistor and a horizontal GAA transistor. In the gate-all-around transistor, a gate surrounds a region in which a channel is located. Compared to the planar transistor, the gate of the gate-all-around transistor has a stronger channel control capability and can better suppress a short-channel effect.

In order to expand the scalability of these devices, a new architecture has been provided, which is referred to as a Forksheet (fork-shaped gate transistor) device. Compared with the GAA transistor or a Nanosheet transistor, in the Forksheet device, a channel is controlled by a fork-shaped gate structure, and a "dielectric wall" is introduced between an nFET device and a pFET device. The arrangement of the dielectric wall causes a smaller spacing between the nFET device and the pFET device in a standard cell, so that the Forksheet has better scalability in areas and performance.

However, current performance of the Forksheet still needs to be improved.

SUMMARY

A problem addressed by embodiments and implementations of the present disclosure is to provide a semiconductor structure and a formation method thereof, which reduces the influence of the dielectric wall on the stress applied by the source/drain doped layers to the channel layers, thereby optimizing performance of the semiconductor structure.

To address the above problems, one form of the present disclosure provides a semiconductor structure, including: a substrate including a discrete device unit region, where the device unit region includes a plurality of sub-device regions arranged in a longitudinal direction; protruding portions protruding from the substrate in the sub-device regions and extending in a transverse direction; channel structure layers located on the protruding portions and spaced apart from the protruding portions, where each of the channel structure layers includes one or more channel layers spaced apart from each other in sequence from bottom to top; a dielectric wall located on the substrate between adjacent sub-device regions in the longitudinal direction, where the dielectric wall includes a main dielectric wall portion protruding from the substrate and dielectric wall protrusions protruding from the main dielectric wall portion in the longitudinal direction, where the dielectric wall protrusions are in contact with side walls of the channel layers; gate structures located on the sub-device regions, spanning tops of the channel structure layers in the sub-device regions, and surrounding the channel layers exposed from the dielectric wall; and source/drain doped layers located on the protruding portions on two sides of the gate structures and in contact with the channel structure layers.

Another form of the present disclosure provides a method for forming a semiconductor structure, including: providing a substrate, where the substrate includes a discrete device unit region, where the device unit region includes a plurality of sub-device regions arranged in a longitudinal direction, protruding portions extending in a transverse direction are formed on the substrate in the sub-device regions, and deck structures are formed on the protruding portions, where each of the deck structures include one or more stacked channel decks, and an initial dielectric wall in contact with the deck structures is formed between the deck structures in the longitudinal direction; forming a dummy gate structure spanning the deck structures and the initial dielectric wall on the substrate, and forming source/drain doped layers in the deck structures on two sides of the dummy gate structure; removing the dummy gate structure to form a gate opening to expose the deck structures; removing sacrificial layers in the channel decks to form through grooves, where the through grooves are formed by the protruding portions, the channel layers adjacent to the protruding portions, and the initial dielectric wall or formed by adjacent channel layers and the initial dielectric wall, and the through grooves are in communication with the gate opening; performing isotropic etching processing on the initial dielectric wall to form a dielectric wall, where the dielectric wall includes a main dielectric wall portion protruding from the substrate and dielectric wall protrusions protruding from the main dielectric wall portion in the longitudinal direction, where the dielectric wall protrusions are in contact with side walls of the channel layers; and forming gate structures in the gate opening and the through grooves of the sub-device regions after the dielectric wall is formed.

Compared with the prior art, the technical solutions of embodiments and implementations of the present disclosure have at least the following advantages:

In a semiconductor structure provided in one form of the present disclosure, the dielectric wall includes a main dielectric wall portion protruding from the substrate and dielectric wall protrusions protruding from the main dielectric wall portion in the longitudinal direction. The dielectric wall protrusions are in contact with the side walls of the channel layers. Compared with the solution in which the dielectric wall does not have the dielectric wall protrusions and has flush side walls, in forms of the present disclosure, by disposing the dielectric wall protrusions, the dielectric wall protrusions are easier to deform when subjected to stress, which facilitates a reduction in the resistance of the dielectric wall to the stress in the channel layers, correspondingly reducing the influence of the dielectric wall on the stress applied by the source/drain doped layers to the channel layers, thereby helping to increase carrier mobility in the channel layers, and improving the performance of the semiconductor structure.

In some implementations, bottom walls of the dielectric wall protrusions are retracted relative to bottom walls of the channel layers, and top walls of the dielectric wall protrusions are retracted relative to top walls of the channel layers. Therefore, top corners and bottom corners of the channel layers close to the dielectric wall can be exposed from the dielectric wall, thereby reducing a contact area between the dielectric wall and the channel layers. The source/drain doped layers are configured to apply a stress to the channel layers to increase the carrier mobility in the channel layers. The contact area between the dielectric wall and the channel layers is reduced, which correspondingly further reduces the hindering effect of the dielectric wall on the stress in the channel layers, and reduces the influence of the dielectric wall on the stress applied by the source/drain doped layers to the channel layers, thereby helping to increase carrier mobility in the channel layers and optimizing the performance of the semiconductor structure.

In forms of a method for forming a semiconductor structure provided in the present disclosure, isotropic etching processing is performed on the initial dielectric wall to form a dielectric wall. The dielectric wall includes a main dielectric wall portion protruding from the substrate and dielectric wall protrusions protruding from the main dielectric wall portion in the longitudinal direction. The dielectric wall protrusions are in contact with the side walls of the channel layers. Compared with forms in which the dielectric wall does not have the dielectric wall protrusions and has flush side walls, by forming the dielectric wall protrusions in some implementations of the present disclosure, the dielectric wall protrusions are easier to deform when subjected to stress, which facilitates a reduction in the resistance of the dielectric wall to the stress in the channel layers, correspondingly reducing the influence of the dielectric wall on the stress applied by the source/drain doped layers to the channel layers, thereby helping to increase carrier mobility in the channel layers, and improving the performance of the semiconductor structure.

In some implementations, in the step of performing the isotropic etching processing on the initial dielectric wall to form the dielectric wall, bottom walls of the dielectric wall protrusions are retracted relative to bottom walls of the channel layers, and top walls of the dielectric wall protrusions are retracted relative to top walls of the channel layers. Therefore, top corners and bottom corners of the channel layers close to the dielectric wall can be exposed from the dielectric wall, thereby reducing a contact area between the dielectric wall and the channel layers. The source/drain doped layers are configured to apply a stress to the channel layers to increase the carrier mobility in the channel region. The contact area between the dielectric wall and the channel layers is reduced, which correspondingly further reduces the hindering effect of the dielectric wall on the stress in the channel layers, and reduces the influence of the dielectric wall on the stress applied by the source/drain doped layers to the channel layers, thereby helping to increase carrier mobility in the channel layers and optimizing the performance of the semiconductor structure.

In some implementations, after the isotropic etching processing is performed on the initial dielectric wall and before the gate structures are formed, rounding processing is performed on corners of the channel layers, so that corners of the channel layers are arc-shaped. Therefore, thicknesses of end portions of the channel layers in the longitudinal direction are correspondingly less than thicknesses of middle positions of the channel layers, so that a size of the channel layer in contact with the dielectric wall is less than the maximum thickness of the channel layers, which can further reduce the hindering effect of the dielectric wall on the stress in the channel layers, and reduce the influence of the dielectric wall on a stress applied by the source/drain doped layers to the channel layers, further increasing the carrier mobility in the channel layers.

DETAILED DESCRIPTION

It can be seen from the background that the performance of a Forksheet device needs to be improved at present. Reasons why performance of the semiconductor structure is still to be improved are now analyzed in combination with a semiconductor structure.

Figure 1:
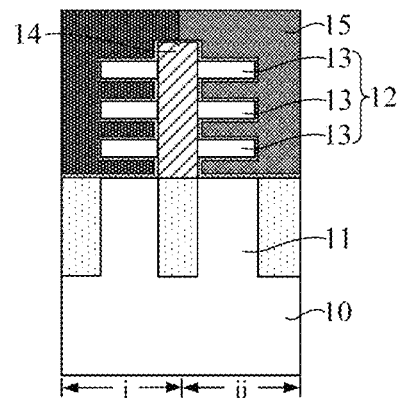
FIG. 1 is a schematic structural diagram of a semiconductor structure.

FIG. 1 is a schematic structural diagram of a semiconductor structure. Specifically, FIG. 1 is a cross-sectional view at positions of channel structure layers in a direction perpendicular to an extension direction (that is, a longitudinal direction) of the channel structure layers.

The semiconductor structure includes: a substrate 10, including a discrete device unit region (not marked), where the device unit region includes a first sub-device region i and a second sub-device region ii spaced apart from each other in a longitudinal direction, where the first sub-device region i is configured to form a transistor of a first type, the second sub-device region ii is configured to form a transistor of a second type, and channels of the transistor of the first type and channels of the transistor of the second type have different conductivity types; protruding portions 11 protruding from the substrate 10 of the first sub-device region i and the second sub-device region ii extending in a transverse direction; channel structure layers 12 located on the protruding portions 11 and spaced apart from the protruding portions 11, where each of the channel structure layers 12 includes one or more channel layers 13 spaced apart from each other; a dielectric wall 14 located on the substrate 10 between the channel structure layers 12 in the longitudinal direction and in contact with side walls of the channel structure layers 12; and gate structures 15 spanning tops of the channel structure layers 12 and surrounding the channel layers 13 exposed from the dielectric wall 14.

The semiconductor structure is a fork-shaped gate transistor (Forksheet), and the first sub-device region i and the second sub-device region ii are separated by the dielectric wall, so that a distance between the first sub-device region i and the second sub-device region ii is closer, which is conducive to miniaturization of the device size and improvement of integration of a circuit.

The semiconductor structure usually further includes: source/drain doped layers (not shown) located on the protruding portions 11 on two sides of the gate structures 15 and in contact with the channel structure layers 12, where the source/drain doped layers are configured to provide a stress for the channel layers 13 to increase carrier mobility.

However, since in the longitudinal direction (that is, perpendicular to extension directions of the channel structure layers), the dielectric wall 14 is provided between the channel layers 13 in adjacent sub-device regions, and side walls of the channel layers 13 are in contact with the dielectric wall 14. The dielectric wall 14 easily hinders the stress applied by the source/drain doped layers to the channel layers 13, causing the channel layers 13 to have a smaller stress at a position close to the dielectric wall 14, which has no obvious effects of increasing the carrier mobility of the device channel, resulting in poor performance of the device.

In order to address the technical problem, one form of the present disclosure provides a semiconductor structure. The dielectric wall includes a dielectric wall protruding portion protruding from the main dielectric wall portion in the longitudinal direction, and the dielectric wall protrusions are in contact with the side walls of the channel layers. In addition, bottom walls of the dielectric wall protrusions are retracted relative to bottom walls of the channel layers, and top walls of the dielectric wall protrusions are retracted relative to top walls of the channel layers. Therefore, top corners and bottom corners of the channel layers close to the dielectric wall can be exposed from the dielectric wall, thereby reducing a contact area between the dielectric wall and the channel layers. The source/drain doped layers is configured to apply a stress to the channel layers to increase the carrier mobility in the channel region. The contact area between the dielectric wall and the channel layers is reduced, which correspondingly reduces the hindering effect of the dielectric wall on the stress in the channel layers, and reduces the influence of the dielectric wall on the stress applied by the source/drain doped layers to the channel layers, thereby helping to increase carrier mobility in the channel layers and optimizing the performance of the semiconductor structure.

Figure 2:
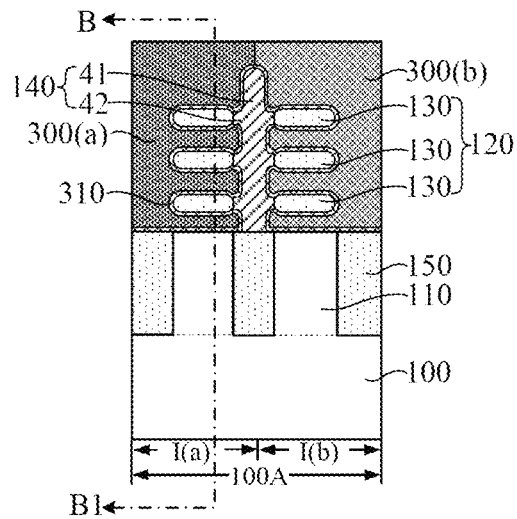
FIG. 2 and FIG. 3 are schematic structural diagrams of one form of a semiconductor structure according to the present disclosure.
Figure 3:
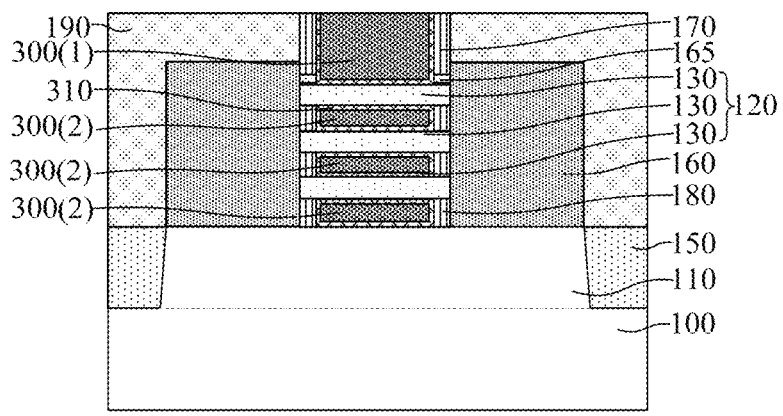

To make the foregoing objectives, features, and advantages of embodiments and implementations of the present disclosure more comprehensible, specific embodiments and implementations of the present disclosure are described below in detail with reference to the accompanying drawings. FIG. 2 and FIG. 3 are schematic structural diagrams of one form of a semiconductor structure according to the present disclosure. FIG. 2 is a cross-sectional view at positions of channel structure layers in a direction perpendicular to an extension direction (that is, a longitudinal direction) of the channel structure layers, and FIG. 3 is a cross-sectional view of FIG. 2 taken along B-B1.

As shown in FIG. 2 and FIG. 3, in this form, the semiconductor structure includes: a substrate 100 including a discrete device unit region 100A, where the device unit region 100A includes a plurality of sub-device regions I arranged in a longitudinal direction; protruding portions 110 protruding from the substrate 100 in the sub-device region I, where the protruding portions 110 extend in a transverse direction; channel structure layers 120 located on the protruding portions 110 and spaced apart from the protruding portions 110, where the channel structure layers 120 includes one or more channel layers 130 spaced apart from each other in sequence from bottom to top; a dielectric wall 140 located on the substrate 100 between adjacent sub-device regions I in the longitudinal direction, where the dielectric wall 140 includes a main dielectric wall portion 41 protruding from the substrate 100 and dielectric wall protrusions 42 protruding from the main dielectric wall portion 41 in the longitudinal direction, where the dielectric wall protrusions 42 are in contact with side walls of the channel layers 130; gate structures 300 located in the sub-device regions I, spanning tops of the channel structure layers 120 in the sub-device region I, and surrounding the channel layers 130 exposed from the dielectric wall 140; and source/drain doped layers 160 located on the protruding portions 110 on two sides of the gate structures 300 and in contact with the channel structure layers 120.

The substrate 100 is configured to provide a process platform for forming a fork-shaped gate transistor.

In some implementations, the substrate 100 is a silicon substrate; that is, a material of the substrate is monocrystalline silicon. In other implementations, the material of the substrate may further be at least one of germanium, silicon germanium, silicon carbide, gallium nitride, gallium arsenide or indium gallium phosphide. The substrate may also be a substrate of another type, such as a Si substrate on an insulator or a Ge substrate on an insulator.

The device unit region 100A is configured to form a device unit.

The device unit region 100A includes a plurality of sub-device regions I arranged in a longitudinal direction. In some implementations, the device unit region 100A includes two sub-device regions I, that is, the device unit region 100A includes a first sub-device region I(a) and a second sub-device region I(b) arranged in the longitudinal direction. In other implementations, a quantity of sub-device regions included in the device unit region may further be greater than two, for example, three, four, and the like.

In some implementations, the first sub-device region I(a) is configured to form a first-type transistor thereon, and the second sub-device region II(b) is configured to form a second-type transistor thereon, and channels of the transistor of the second type and channels of the transistor of the first type have different conductivity types.

For example, the first-type transistor is a PMOS transistor, and the second-type transistor is an NMOS transistor. In other implementations, the first-type transistor is an NMOS transistor, and the second-type transistor is a PMOS transistor.

In some implementations, the protruding portion 110 and the substrate 100 are integrally formed. The material of the protruding portion 110 is the same as that of the substrate 100 and t is silicon. In other implementations, a material of the protruding portions may be different from a material of the substrate. The material of the protruding portions may be other suitable materials, for example, at least one of monocrystalline silicon, germanium, silicon germanium, silicon carbide, gallium nitride, gallium arsenide, or indium gallium.

In some implementations, the protruding portion 110 is a fin structure.

In some implementations, the protruding portions 110 extend in the transverse direction, the plurality of protruding portions 110 on the substrate 100 are spaced apart from each other in the longitudinal direction, and the longitudinal direction is perpendicular to the transverse direction.

The semiconductor structure further includes isolation structures 150 located on the substrate 100 on sides of the protruding portions 110. In some implementations, the top surface of the isolation structure 150 is flush with the top surface of the protruding portion 110.

The isolation structure 150 is configured to isolate adjacent protruding portions 110 and further configured to isolate the gate structures 300 from the substrate 100.

In some implementations, the material of the isolation structure 150 is silicon oxide. The isolation structure 150 may further be made of other suitable insulating materials.

The channel structure layer 120 is configured to provide a conduction channel of a field-effect transistor.

In some implementations, the channel structure layers 120 and the protruding portions 110 have the same extension direction, both of which extend in the transverse direction.

In some implementations, in order to improve process compatibility, materials of the channel layers 130 in the different sub-device regions I are the same. In some implementations, the material of the channel layer 130 is Si. In other implementations, a material of the channel layer may alternatively be SiGe. In yet other implementations, the material of the channel layers may further be at least one of germanium, silicon germanium, silicon carbide, gallium nitride, gallium arsenide, or indium gallium.

In other implementations, materials of the channel layers in the different sub-device regions may further be different. For example, when channels of transistors formed in adjacent sub-device regions have different conductivity types, for sub-device regions for forming an NMOS transistor, a material of the channel layers is Si, and for sub-device regions for forming a PMOS transistor, a material of the channel layers is SiGe.

As an example, a plurality of channel layers 130 are provided, and the plurality of channel layers 130 are spaced apart from each other in sequence from bottom to top. Specifically, in some implementations, a quantity of channel layers 130 is three. In other implementations, the quantity of channel layers may further be one, two, four, and the like.

In some implementations, corners of the channel layers 130 surrounded by the gate structures 300 are arc-shaped, that is, top corners and bottom corners of the channel layers 130 surrounded by the gate structures 300 are round corners. Therefore, thicknesses of end portions of the channel layers 130 in the longitudinal direction are correspondingly less than thicknesses of middle positions of the channel layers 130, so that a size of the channel layer 130 in contact with the dielectric wall 140 is less than the maximum thickness of the channel layers 130, which can further reduce the hindering effect of the dielectric wall 140 on the stress in the channel layers 130, and reduce the influence of the dielectric wall 140 on a stress applied by the source/drain doped layers 160 to the channel layers 130, further increasing the carrier mobility in the channel layers 130.

In other implementations, based on actual process requirements, the corners of the channel layers may not be arc-shaped, and the corners of the channel layers may be corners at right angles or other angles.

The dielectric wall 140 is configured to physically isolate the channel structure layers 120 and the source/drain doped layers 160 in adjacent sub-device regions I, so that adjacent transistors can be spaced apart from each other by a smaller interval.

In some implementations, the dielectric wall 140 is configured to isolate the channel structure layers 120 from the source/drain doped layers 160 of the first sub-device region I(a) and the second sub-device region I(b), so that the transistor of the first type and the transistor of the second type can be spaced apart from each other by a smaller interval.

A top surface of the dielectric wall 140 is higher than top surfaces of the channel structure layers 120 and higher than top surfaces of the source/drain doped layers 160, so that the dielectric wall 140 can isolate the channel structure layers 120 and the source/drain doped layers 160 in adjacent sub-device regions I.

In some implementations, in the longitudinal direction, the dielectric wall 140 is located on an isolation structure 150 adjacent to the channel structure layers 120.

The material of the dielectric wall 140 is a dielectric material, and the material of the dielectric wall 140 includes at least one of silicon nitride, silicon oxynitride, silicon carbide, silicon oxycarbonitride, silicon carbonitride, or silicon carboboronitride. In an example, the material of the dielectric wall 140 is silicon nitride.

The dielectric wall protrusions 42 are in contact with the side walls of the channel layers 130. Compared with the solution in which the dielectric wall does not have the dielectric wall protrusions and has flush side walls, in some implementations, by disposing the dielectric wall protrusions 42, the dielectric wall protrusions 42 are easier to deform when subjected to stress, which facilitates a reduction in the resistance of the dielectric wall 140 to the stress in the channel layers, correspondingly reducing the influence of the dielectric wall 140 on the stress applied by the source/drain doped layers 160 to the channel layers 130, thereby helping to increase carrier mobility in the channel layers 130, and improving the performance of the semiconductor structure.

In some implementations, bottom walls of the dielectric wall protrusions 42 are retracted relative to bottom walls of the channel layers 130, and top walls of the dielectric wall protrusions 42 are retracted relative to top walls of the channel layers 130. Therefore, top corners and bottom corners of the channel layers 130 close to the dielectric wall 140 can be exposed from the dielectric wall 140, thereby reducing a contact area between the dielectric wall 140 and the channel layers 130. The source/drain doped layers 160 are configured to apply a stress to the channel layers 130 to increase the carrier mobility in the channel region. The contact area between the dielectric wall 140 and the channel layers 130 is reduced, which correspondingly further reduces the hindering effect of the dielectric wall 140 on the stress in the channel layers 130, and reduces the influence of the dielectric wall 140 on the stress applied by the source/drain doped layers 160 to the channel layers 130, thereby helping to increase carrier mobility in the channel layers 130 and optimizing the performance of the semiconductor structure. In some implementations, the main dielectric wall portion 41 and the dielectric wall protrusions 42 are integrally formed, which facilitates improvement of the isolation effect of the dielectric wall 140 for adjacent sub-device regions I.

In some implementations, the corners of the channel layers 130 are arc-shaped. Since in some implementations, during the formation of the semiconductor structure, the gate structures 300 are usually formed in the gate opening and the through grooves. After the gate opening and the through grooves are formed, isotropic etching processing is performed on the initial dielectric wall to form the dielectric wall 140 and expose the corners of the channel layers 130 close to the end portion of the dielectric wall 140, and after the dielectric wall 140 is formed, rounding processing on corners is further performed on the channel layers 130, so that the corners of the channel layers 130 are arc-shaped.

It is to be noted that the bottom walls of the dielectric wall protrusions 42 are retracted relative to bottom walls of the channel layers 130, or top walls of the dielectric wall protrusions 42 are retracted relative to top walls of the channel layers 130 by a first retraction size. The first retraction size should not be excessively small or excessively large. If the bottom walls of the dielectric wall protrusions 42 are retracted relative to the bottom walls of the channel layers 130 by an excessively small size, the effect of reducing the contact area between the channel layers 130 and the dielectric wall 140 is not obvious. If the bottom walls of the dielectric wall protrusions 42 are retracted relative to the bottom walls of the channel layers 130 by an excessively large size, the contact area between the dielectric wall protrusions 42 and the channel layers 130 is excessively small, which is easy to increase process risks. In some implementations, the first retraction size is 7.5 nm to 15 nm. For example, the first retraction size is 8 nanometers, 9 nanometers, 10 nanometers, and the like.

It is to be further noted that, in the longitudinal direction, a single side wall of the main dielectric wall portion 41 is retracted relative to side walls of the dielectric wall protrusions 42 on the same side by a second retraction size. The second retraction size should not be excessively small or excessively large. If the second retraction size is excessively small, the first retraction size is likely to be excessively small, and it is also easy to cause an exposed area of a corner at end portions of the channel layers 130 close to the dielectric wall 140 to be excessively small. During rounding processing on the corners of the channel layers 130, an arc of the corners at the end portions of the channel layers 130 close to the dielectric wall 140 is excessively small. To this end, in some implementations, in the longitudinal direction, the single side wall of the main dielectric wall portion 41 is retracted relative to the side walls of the dielectric wall protrusions 42 on the same side by 7.5 nanometers to 15 nanometers.

The gate structure 300 located on each of the sub-device regions I is configured to control opening and closing of conductive channels of the corresponding sub-device region I.

As an example, the device unit region 100A includes a first sub-device region I(a) and a second sub-device region I(b), the gate structure 300 located on the first sub-device region I(a) serves as a first gate structure 300(a), and the gate structure 300 located on the second sub-device region I(b) serves as a second gate structure 300(b). The first gate structure 300(a) is configured to control opening and closing of a conductive channel of the first sub-device region I(a), and the second gate structure 300(b) is configured to control opening and closing of a conductive channel of the second sub-device region I(b).

In some implementations, the gate structure 300 is a metal gate structure. A material of the gate structures 300 includes at least one of TiN, TaN, Ti, Ta, TiAL, TiALC, TiSiN, W, Co, Al, Cu, Ag, Au, Pt, or Ni.

The gate structure 300 may include a work function layer (not shown) and a gate electrode layer (not shown) located on the work function layer. The work function layer may be filled or unfilled between adjacent channel layers 130 or between the protruding portions 110 and adjacent channel layers 130.

In some implementations, the transistor of the first type is a PMOS transistor, and the first gate structure 300(a) includes a first work function layer. The transistor of the second type is an NMOS transistor, and the second gate structure 300(b) includes a second work function layer.

The work function layer is configured to adjust a work unction of the transistor. Correspondingly, a material of the first work function layer is a P-type work function material, and a material of the second work function layer is an N-type work function material.

In some implementations, the materials of the first work function layer and the second work function layer are different. The dielectric wall 140 is disposed to prevent the steps of forming the first work function layer and the second work function layer from affecting each other during the formation of the first gate structure 300(a) and the second gate structure 300(b), thereby improving integrity of the first gate structure 300(a) and the second gate structure 300(b), and improving the performance of the semiconductor structure.

The gate electrode layer serves as an electrode for implementing an electrical connection between the gate structure 300 and an external circuit or other interconnection structures. In some implementations, materials of gate electrode layers of the first gate structure 300(a) and the second gate structure 300(b) are the same, since the gate electrode layers of the first gate structure 300(a) and the second gate structure 300(b) are formed in the same step after the first work function layer and the second work function layer are formed.

This implementation is described using a metal gate structure as an example of the gate structure 300. In other implementations, based on actual process requirements, the gate structures may further be other types of gate structures, for example, a polysilicon gate structure or an amorphous silicon gate structure.

In some implementations, the gate structures 300 between adjacent sub-device regions I in the longitudinal direction are in contact with each other on a top of the dielectric wall 140, so that the gate structures 300 between adjacent sub-device regions I can be electrically connected, so that the transistors in adjacent sub-device regions I can be used in conjunction.

In some implementations, the first gate structure 300(a) and the second gate structure 300(b) are in contact with each other on the top of the dielectric wall 140.

In some implementations, in a transverse direction, side walls of the gate structures 300 are retracted relative to side walls of the channel layers 130 on the same side, parts of the gate structures 300 that span the channel structure layers 120 serve as first parts 300(1), and parts of the gate structures 300 that are located between adjacent channel layers 130 or between the protruding portions and the channel layers 130 adjacent to the protruding portions 110 serve as second parts 300(2).

In some implementations, the semiconductor structure further includes: a gate dielectric layer 310, located between the channel layer 130 and the gate structure 300, and between the dielectric wall 140 and the gate structure 300. In some implementations, the gate dielectric layer 310 further locates between the gate structure 300 and the protruding portion 110, and between the gate structure 300 and the isolation structure 150.

The gate dielectric layer 310 is configured to electrically isolate the gate structure 300 from the channels. A material of the gate dielectric layers 310 includes at least one of silicon oxide, nitrogen-doped silicon oxide, $HfO_2$, $ZrO_2$, HfSiO, HfSiON, HfTaO, HfTiO, HfZrO, $La_2O_3$, or $Al_2O_3$.

The gate dielectric layer 310 may be a gate oxide layer or a high-k gate dielectric layer; or the gate dielectric layer 310 includes a gate oxide layer and a high-k gate dielectric layer located on the gate oxide layer.

A material of the gate oxide layer may be silicon oxide or silicon oxynitride. The material of the high-k gate dielectric layer is a high-k dielectric material. The material of the high-k gate dielectric layer may be selected from $HfO_2$, $ZrO_2$, HfSiO, HfSiON, HfTaO, HfTiO, HfZrO or $Al_2O_3$.

In some implementations, the gate dielectric layer 310 is a high-k dielectric layer.

In some implementations, the semiconductor structure further includes: gate side walls 170 located on side walls of the first parts 300(1); and inner side walls 180 located between the second parts 300(2) and the source/drain doped layers 160 in the transverse direction.

The gate side walls 170 also spans a part of the channel structure layers 120 correspondingly. The gate side walls 170 are configured to define formation positions of the source/drain doped layers 160 and isolate the source/drain doped layers 160 from the gate structures 300, and the gate side walls 170 are further configured to protect the side walls of the first parts 300(1).

In some implementations, the material of the gate side walls 170 includes silicon nitride, silicon oxide, silicon oxynitride, a low-k dielectric material, or an ultra-low-k dielectric material, and the gate side walls 170 are single-layer structures or deck structures. In an example, the gate side wall 170 is of a single-layer structure, and the material of the gate side wall 170 is silicon nitride.

The inner side walls 180 are configured to implement isolation between the source/drain doped layers 160 and the gate structures 300, and is further configured to increase a distance between the source/drain doped layers 160 and the gate structures 300 to reduce parasitic capacitance between the gate structures 300 and the source/drain doped layers 160.

In some implementations, the material of the inner side walls 180 is an insulating material to implement isolation between the source/drain doped layers 160 and the gate structures 300. In some implementations, the material of the inner side walls 180 includes silicon nitride, silicon oxide, silicon oxynitride, a low-k dielectric material, or an ultra-low-k dielectric material. In some implementations, the material of the inner side wall 180 is silicon nitride.

The source/drain doped layers 160 are used as sources or drains of a field effect transistor. When the field effect transistor is in operation, the source/drain doped layers 160 are configured to provide carrier sources.

In some implementations, the source/drain doped layer 160 includes stress layers doped with ions, and the stress layers are configured to provide stress for the channel, so as to improve the carrier mobility.

In some implementations, when a PMOS transistor is formed, the source/drain doped layers 160 include stress layers doped with P-type ions and the material of the stress layer is Si or SiGe; and when an NMOS transistor is formed, the source/drain doped layers 160 include stress layers doped with N-type ions, and the material of the stress layer is Si or SiC.

In some implementations, the transistor of the first type is a PMOS transistor, and the source/drain doped layers 160 of the first sub-device region I(a) include stress layers doped with P-type ions. The transistor of the second type is an NMOS transistor, and the source/drain doped layers 160 of the second sub-device region I(b) include stress layers doped with N-type ions.

The source/drain doped layers 160 between adjacent sub-device regions I are separated by the dielectric wall 140, so that when the materials and doped ions of the source/drain doped layers 160 in adjacent sub-device regions I are different, the processes of formation of the source/drain doped layers 160 in different sub-device regions I can be prevented from affecting each other.

In some implementations, the source/drain doped layer 160 is located in the gate structure 300 and the protruding portions 110 on two sides of the gate side wall 170. In some implementations, the source/drain doped layers 160 cover side walls of the channel structure layers 120 and the inner side walls 180.

In some implementations, the semiconductor structure further includes: interlayer dielectric layers 190 located on the substrate 100 on side portions of the gate structures 300 and covering the source/drain doped layers 160. Specifically, the interlayer dielectric layers 190 are located on an isolation structure 150.

The interlayer dielectric layer 190 is configured to isolate adjacent devices. In some implementations, the material of the interlayer dielectric layer 190 is silicon oxide. A material of the interlayer dielectric layer 190 may further be an insulation material.

Accordingly, the present disclosure further provides a forming method of a semiconductor structure. FIG. 4 to FIG. 19 are schematic structural diagrams corresponding to steps in one form of a forming method of a semiconductor structure according to the present disclosure.

Implementations of a forming method of a semiconductor structure are described in detail below with reference to the accompanying drawings.

Figure 4:
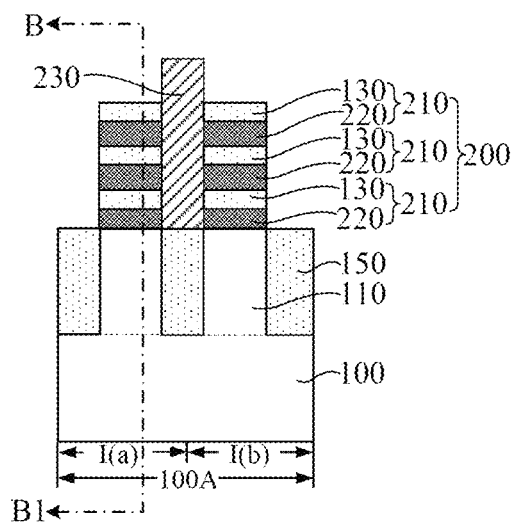
FIG. 4 to FIG. 19 are schematic structural diagrams corresponding to steps in one form of a forming method of a semiconductor structure according to the present disclosure.
Figure 5:
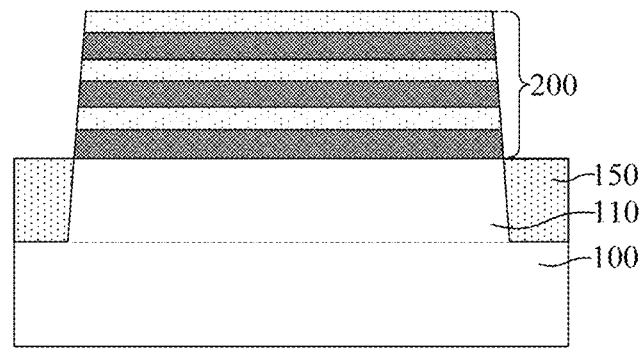

Referring to FIG. 4 and FIG. 5, FIG. 4 is a cross-sectional view in a direction perpendicular to an extension direction of channel decks at positions of deck structures, and FIG. 5 is a cross-sectional view of FIG. 4 taken along B-B1. A substrate 100 is provided, including a discrete device unit region 100A, where the device unit region 100A includes a plurality of sub-device regions I arranged in a longitudinal direction. Protruding portions 110 extending in a transverse direction and protruding, are formed on the substrate 100 in the sub-device regions I, and deck structures 200 are formed on the protruding portions 110. The deck structures 200 include one or more stacked channel decks 210, and an initial dielectric wall 230 in contact with the deck structures 200 is formed between the deck structures 200 in the longitudinal direction.

The substrate 100 is configured to provide a process platform for subsequent processes.

In some implementations, the substrate 100 is a silicon substrate; that is, a material of the substrate is monocrystalline silicon. In other implementations, the material of the substrate may further be at least one of germanium, silicon germanium, silicon carbide, gallium nitride, gallium arsenide or indium gallium phosphide. The substrate may also be a substrate of another type, such as a Si substrate on an insulator or a Ge substrate on an insulator.

The device unit region 100A is configured to form a device unit.

The device unit region 100A includes a plurality of sub-device regions I arranged in a longitudinal direction. In some implementations, the device unit region 100A includes two sub-device regions I, that is, the device unit region 100A includes a first sub-device region I(a) and a second sub-device region I(b) arranged in the longitudinal direction. In other implementations, a quantity of sub-device regions included in the device unit region may further be greater than two, for example, three, four, and the like.

In some implementations, the first sub-device region I(a) is configured to form a first-type transistor thereon, and the second sub-device region II(b) is configured to form a second-type transistor thereon, and channels of the transistor of the second type and channels of the transistor of the first type have different conductivity types.

For example, the first-type transistor is a PMOS transistor, and the second-type transistor is an NMOS transistor. In other implementations, the first-type transistor is an NMOS transistor, and the second-type transistor is a PMOS transistor.

In some implementations, the protruding portion 110 and the substrate 100 are integrally formed. The material of the protruding portion 110 is the same as that of the substrate 100 and t is silicon. In other implementations, a material of the protruding portions may be different from a material of the substrate. The material of the protruding portions may be other suitable materials, for example, at least one of monocrystalline silicon, germanium, silicon germanium, silicon carbide, gallium nitride, gallium arsenide, or indium gallium.

In some implementations, the protruding portions 110 extend in the transverse direction, the plurality of protruding portions 110 on the substrate 100 are spaced apart from each other in the longitudinal direction, and the longitudinal direction is perpendicular to the transverse direction.

In some implementations, an isolation structure 150 is further formed on the substrate 100 on sides of the protruding portions 110.

The isolation structure 150 is configured to isolate adjacent protruding portions 110 and further configured to isolate the gate structures 300 from the substrate 100.

In some implementations, the material of the isolation structure 150 is silicon oxide. The isolation structure 150 may further be made of other suitable insulating materials.

The channel decks 210 provide a process basis for the subsequent formation of the channel layers 130 in a spaced suspension arrangement. Specifically, the channel layers 130 are configured to provide the conductive channel of the field effect transistor, and the sacrificial layers 220 are configured to support the channel layers 130, thereby providing a process basis for subsequently implementing the spaced suspension arrangement of the channel layers 130. The sacrificial layers 220 are further configured to occupy a spatial location for subsequently forming gate structures.

As an example, side walls of the deck structures 200 and the protruding portions 110 are flush with each other, and the deck structures 200 and the protruding portions 110 form a fin structure.

In some implementations, to improve process compatibility, materials of the channel layers 130 in different sub-device regions I are different, and materials of the sacrificial layers 220 in different sub-device regions I are the same.

In some implementations, the material of the channel layers 130 is Si, and the material of the sacrificial layers 220 is SiGe. During subsequent removal of the sacrificial layers 220, SiGe and Si are selected for etching at a relatively high possibility. Therefore, the sacrificial layers 220 are enabled to be made of SiGe, and the channel layers 130 are enabled to be made of Si, which can effectively reduce an influence of the removal process of sacrificial layers 220 on the channel layers 130, thereby improving quality of the channel layers 130, and further helping improve device performance.

In other implementations, the material of the channel layers may also be SiGe, and the material of the sacrificial layers is Si. In other implementations, the material of the channel layers may further be one or more of germanium, silicon germanium, silicon carbide, gallium nitride, gallium arsenide, and indium gallium.

In other implementations, materials of the channel layers in the different sub-device regions may further be different. For example, when channels of transistors formed in adjacent sub-device regions have different conductivity types, for sub-device regions for forming an NMOS transistor, a material of the channel layers is Si, and for sub-device regions for forming a PMOS transistor, a material of the channel layers is SiGe.

As an example, a plurality of channel decks 210 are provided, and the plurality of channel decks 210 are stacked in a direction perpendicular to a surface of the substrate 100.

Specifically, in some implementations, a quantity of channel decks 210 is three. In other implementations, the quantity of channel decks may further be one, two, four, and the like.

In the longitudinal direction, the initial dielectric wall 230 is configured to isolate the deck structures 200 between adjacent sub-device regions I, so that the adjacent sub-device regions I can be spaced apart from each other by a smaller interval.

A top surface of the initial dielectric wall 230 is higher than top surfaces of the deck structures 200, so that the initial dielectric wall 230 can isolate the deck structures 200 between adjacent sub-device regions I.

In some implementations, in the longitudinal direction, the initial dielectric wall 230 is formed on the isolation structures 150 between adjacent deck structures 200.

Therefore, a material of the initial dielectric wall 230 is a dielectric material, for example, at least one of silicon nitride, silicon oxynitride, silicon carbide, silicon carboxynitride, silicon carbonitride, or silicon carboboronitride, so that it can be ensured that the initial dielectric wall 230 can be used for isolation. In some implementations, the initial dielectric wall 230 is made of silicon nitride.

In some implementations, the step of providing the substrate 100, the protruding portions 110, the deck structures 200, the isolation structures 150, and the initial dielectric wall 230 includes: providing the substrate 100, the protruding portions 110, and the deck structures 200 on the protruding portions 110; forming isolation structures 150 on the substrate 100 on sides of the protruding portions 110; and forming the initial dielectric wall 230 between the deck structures 200 in adjacent sub-device regions I in an extension direction perpendicular to the deck structures 200.

The above step of providing the substrate 100, the protruding portions 110, the deck structures 200, the isolation structures 150, and the initial dielectric wall 230 is merely an example and is not limited thereto. For example, in other embodiments and implementations, after the substrate, the protruding portions, and the deck structures are provided, in the extension direction perpendicular to the deck structures, the initial dielectric walls are formed between adjacent protruding portions and between adjacent deck structures. Isolation structures are formed on the substrate on the sides of the protruding portions, and the isolation structures also cover parts of side walls of the initial dielectric wall.

Figure 6:
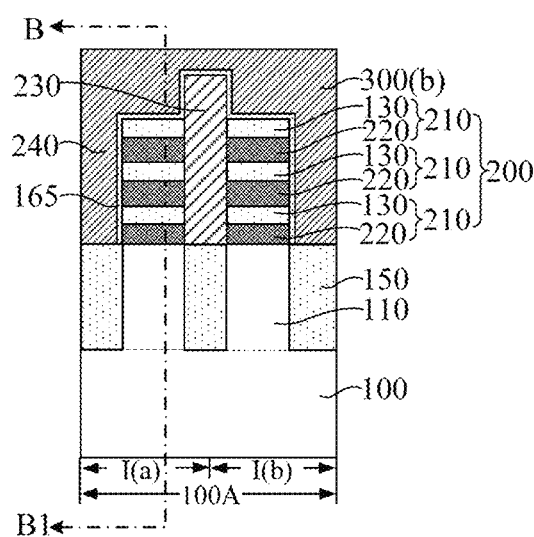
Figure 7:
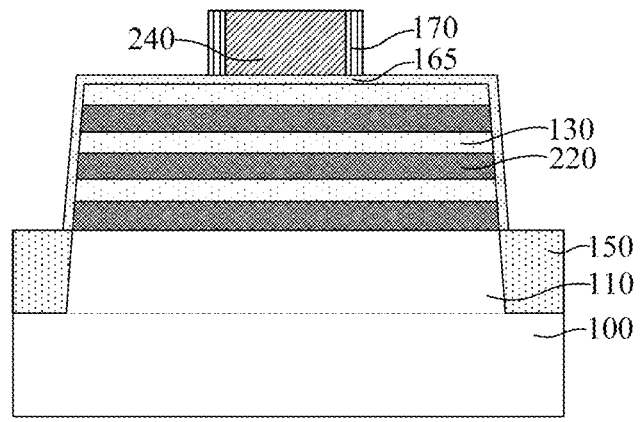

Referring to FIG. 6 and FIG. 7, FIG. 6 is a cross-sectional view in an extension direction of a dummy gate structure at a position of the dummy gate structure, and FIG. 7 is a cross-sectional view of FIG. 6 taken along B-B1. A dummy gate structure 240 spanning the deck structures 200 and the initial dielectric wall 230 is formed on the substrate 100. The dummy gate structure 240 is configured to pre-occupy a spatial position for subsequent formation of a gate structure.

An extension direction of the dummy gate structure 240 is perpendicular to an extension direction of the channel decks 210, that is, the dummy gate structure 240 extends in a longitudinal direction.

The dummy gate structure 240 includes a dummy gate layer, and the dummy gate layer may be a single-layer structure or a deck structure.

In some implementations, the dummy-gate structure 240 is a polysilicon gate structure or an amorphous silicon gate structure. A material of the dummy gate layer includes polysilicon or amorphous silicon.

In some implementations, before the dummy gate structure 240 is formed, the forming method further includes: forming dummy gate oxide layers 165 on top surfaces and side walls of the deck structures 200 and on a top surface and side walls of the initial dielectric wall 230 that are exposed.

The dummy gate oxide layer 165 can serve as an etch stop layer during subsequent removal of the dummy gate structure 240, so as to reduce the probability of damage to the channel layers 130 caused by the removal of the dummy gate structure 240.

In some implementations, a material of the dummy gate oxide layer 165 may be silicon oxide or silicon oxynitride.

Correspondingly, the dummy gate structure 240 covers part of the top and part of the side walls of the dummy gate oxide layer 165 on the deck structures 200 and the initial dielectric wall 230.

In some implementations, the method for forming a semiconductor structure further includes: forming gate side walls 170 on a side wall of the dummy gate structure 240.

The gate side walls 170 are used together with the dummy gate structure 240 as an etching mask for the subsequent etching process of forming the grooves to define formation positions of the source/drain doped layers, and the gate side walls 170 are further configured to protect side walls of the dummy gate structure 240 and subsequent gate structures.

In some implementations, the material of the gate side walls 170 includes silicon nitride, silicon oxide, silicon oxynitride, a low-k dielectric material, or an ultra-low-k dielectric material, and the gate side walls 170 are single-layer structures or deck structures. In an example, the gate side wall 170 is of a single-layer structure, and the material of the gate side wall 170 is silicon nitride.

Referring to FIG. 8 to FIG. 11, the source/drain doped layers 160 are formed in the deck structures 200 on two sides of the dummy gate structure 240. The source/drain doped layers 160 are used as sources or drains of a field effect transistor. When the field effect transistor is in operation, the source/drain doped layers 160 are configured to provide carrier sources.

In some implementations, the source/drain doped layer 160 includes stress layers doped with ions, and the stress layers are configured to provide stress for the channel, to improve the carrier mobility.

In some implementations, when a PMOS transistor is formed, the source/drain doped layers 160 include stress layers doped with P-type ions and the material of the stress layer is Si or SiGe; and when an NMOS transistor is formed, the source/drain doped layers 160 include stress layers doped with N-type ions, and the material of the stress layer is Si or SiC.

In some implementations, the transistor of the first type is a PMOS transistor, and the source/drain doped layers 160 of the first sub-device region I(a) include stress layers doped with P-type ions. The transistor of the second type is an NMOS transistor, and the source/drain doped layers 160 of the second sub-device region I(b) include stress layers doped with N-type ions.

The source/drain doped layers 160 between adjacent sub-device regions I are separated by the initial dielectric wall 230, so that when the materials and doped ions of the source/drain doped layers 160 in adjacent sub-device regions I are different, the processes of formation of the source/drain doped layers 160 in different sub-device regions I can be prevented from affecting each other.

In some implementations, the source/drain doped layers 160 are formed in the deck structures 200 on two sides of the dummy gate structure 240 and the gate side walls 170.

Figure 8:
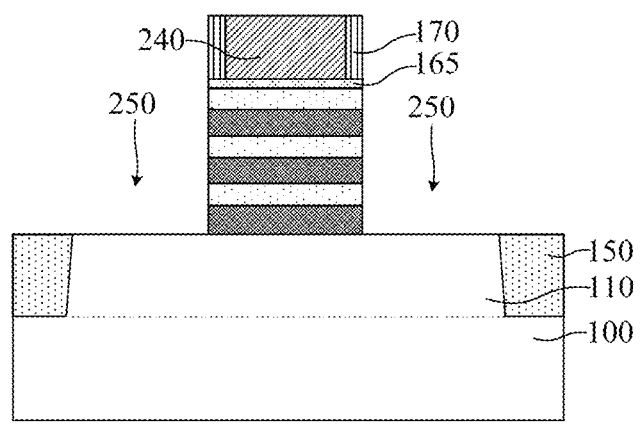
Figure 9:
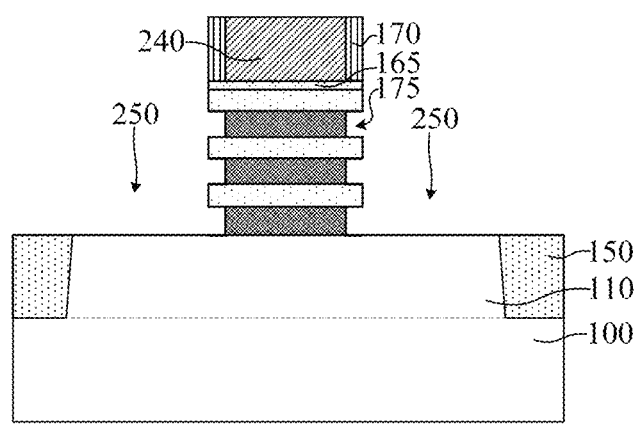
Figure 10:
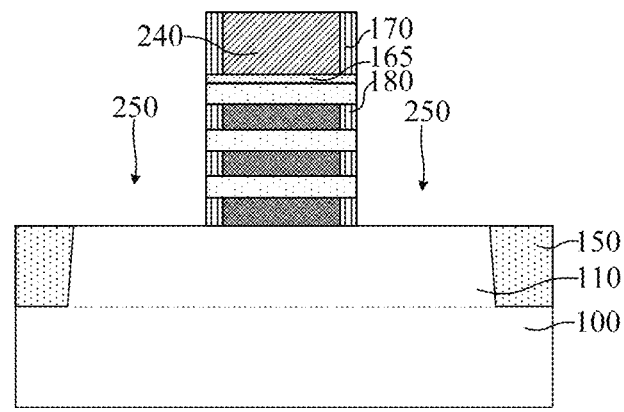
Figure 11:
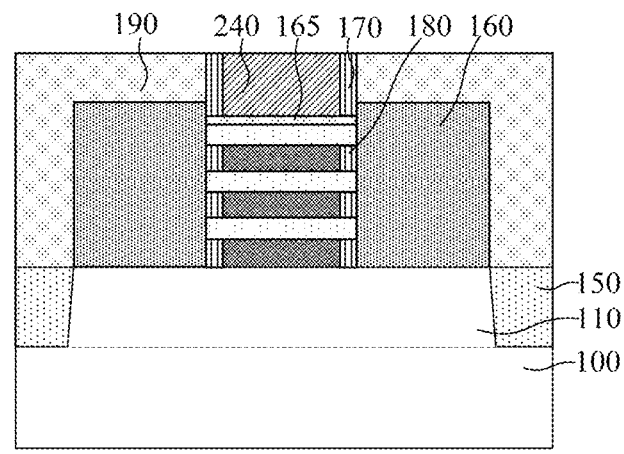

In some implementations, the step of forming the source/drain doped layers 160 includes: as shown in FIG. 8, removing the dummy gate structure 240 and the deck structures 200 on two sides of the gate side walls 170, forming grooves 250 in the deck structures 200, and as shown in FIG. 9 to FIG. 11, forming the source/drain doped layers 160 in the grooves 250.

The groove 250 is configured to provide a spatial position for forming a source/drain doped layer.

In some implementations, stress layers are formed by using an epitaxial process, ions are self-doped in situ during formation of the stress layers, and the stress layers doped with ions are used as the source/drain doped layers 160.

In some implementations, the ion doping types and materials of the source/drain doped layers 160 in the first sub-device region I(a) and the second sub-device region I(b) are different, and therefore, in different steps, corresponding source/drain doped layers 160 are formed in the grooves 250 of the first sub-device region I(a) and the grooves 250 of the second sub-device region I(b).

In some implementations, the method for forming a semiconductor structure further includes: after the grooves 250 are formed and before the source/drain doped layers 160 are formed in the grooves 250, as shown in FIG. 9, in a transverse direction, etching a certain thickness of the sacrificial layers 220 on side walls of the grooves 250 to form side wall trenches 175 on the side walls of the grooves 250; and as shown in FIG. 10, filling the side wall trenches 175 with inner side walls 180.

The side wall trench 175 is configured to provide a spatial position for forming the inner side wall 180.

In some implementations, a certain thickness of the sacrificial layers 220 on side walls of the grooves 250 is etched in the extension direction of the channel layers by using a vapor etching process.

Specifically, in some implementations, the material of the sacrificial layers 220 is SiGe, the material of the channel layers 130 is Si, and vapor etching is performed on the sacrificial layers 220 on the side walls of the grooves 250 by using HCl vapor. A rate of etching the SiGe material by using the HCl vapor is far greater than a rate of etching the Si material, which can effectively reduce the probability of damage to the channel layers 130.

In other implementations, when the material of the channel layers is SiGe and the material of the sacrificial layers is Si, a certain thickness of the sacrificial layers on side walls of the grooves may be etched in the extension direction of the channel layers using a dry etching process.

Subsequently, the gate structures are formed at the positions of the sacrificial layers 220 and the dummy gate structure 240, the inner side walls 180 are configured to implement isolation between the source/drain doped layers 160 and the gate structures, and are further configured to increase distances between the source/drain doped layers 160 and the gate structures to reduce parasitic capacitance between the gate structures and the source/drain doped layers 160.

Correspondingly, the source/drain doped layers 160 cover side walls of the channel layers 130 and the inner side walls 180.

In some implementations, the material of the inner side walls 180 is an insulating material to implement isolation between the source/drain doped layers 160 and the gate structures. The material of the inner side walls 180 includes silicon nitride, silicon oxide, silicon oxynitride, a low-k dielectric material, or an ultra-low-k dielectric material. In some implementations, the material of the inner side wall 180 is silicon nitride.

In some implementations, the forming method further includes: forming interlayer dielectric layers 190 on the substrate 100 of the dummy gate structure 240 and side portions of the gate side walls 170 to cover the source/drain doped layers 160. Specifically, the interlayer dielectric layers 190 are located on an isolation structure 150.

The interlayer dielectric layer 190 is configured to isolate adjacent devices. In some implementations, the material of the interlayer dielectric layer 190 is silicon oxide. A material of the interlayer dielectric layer 190 may further be an insulation material.

In some implementations, the interlayer dielectric layers 190 further expose a top of the dummy gate structure 240 to facilitate subsequent removal of the dummy gate structure 240.

Figure 12:
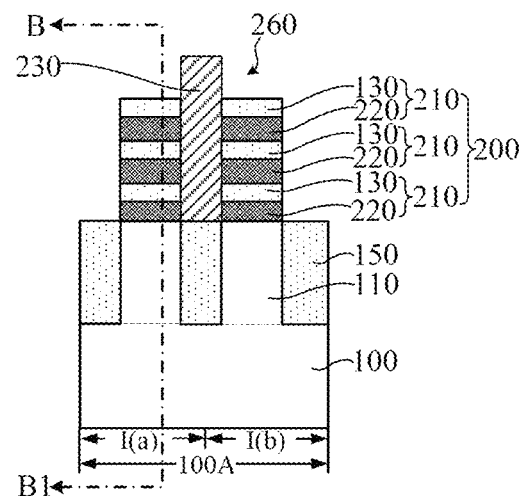
Figure 13:
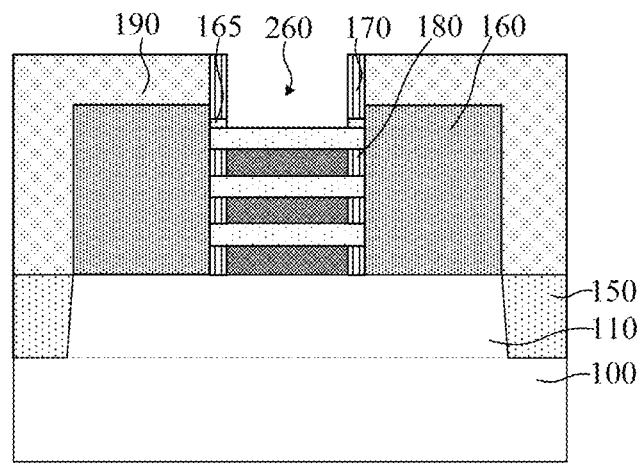

Referring to FIG. 12 and FIG. 13, FIG. 12 is a cross-sectional view in an extension direction perpendicular to the channel decks 210 at a position of a gate opening, and FIG. 13 is a cross-sectional view of FIG. 12 taken along B-B1. The dummy gate structure 240 is removed, and a gate opening 260 is formed to expose the deck structures 200.

The gate opening 260 is configured to provide space for forming the gate structure. The channel decks 210 are exposed from the gate opening 260 to facilitate subsequent removal of the sacrificial layers 220 through the gate opening 260.

In some implementations, the gate opening 260 spans the deck structures 200, and the gate opening 260 is located in the interlayer dielectric layers 190 and is formed by the gate side walls 170.

In some implementations, the dummy gate oxide layer 165 is used as an etch stop layer, and the dummy gate structure 240 is removed, so as to reduce the probability of damage to the channel layers 130 caused by the removal of the dummy gate structure 240.

After the dummy gate structure 240 is removed, the dummy gate oxide layer 165 exposed from the gate opening 260 is further removed.

The dummy gate oxide layer 165 is thinner than the dummy gate structure 240, so the process of removing the dummy gate oxide layer 165 is simpler and takes shorter time, and the removal of the dummy gate oxide layer 165 is not easy to cause damage to the channel layers 130.

Figure 14:
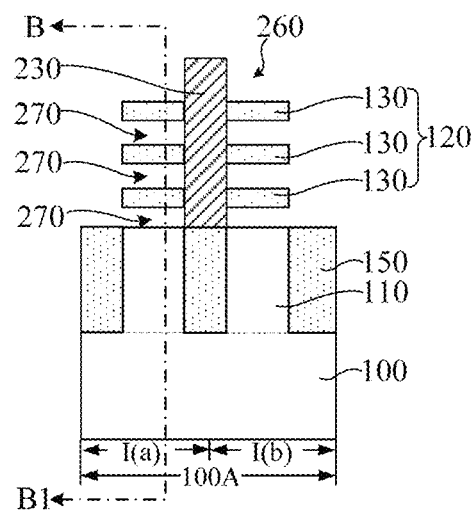
Figure 15:
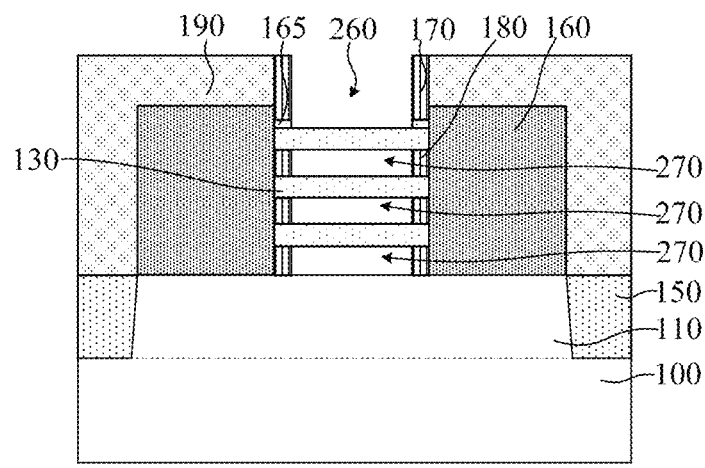

Referring to FIG. 14 and FIG. 15, FIG. 14 is a cross-sectional view in an extension direction perpendicular to the channel decks at the position of the gate opening, and FIG. 15 is a cross-sectional view of FIG. 14 taken along B-B1. Sacrificial layers 220 in the channel decks 210 are removed to form through grooves 270. The through grooves 270 are formed by the protruding portions 110, the channel layers 130 adjacent to the protruding portions 110, and the initial dielectric wall 230. Alternatively, the through grooves 270 are formed by the adjacent channel layers 130 and the initial dielectric wall 230, and the through grooves 270 are in communication with the gate opening 260.

The through grooves 270 and the gate opening 260 provides a spatial position for subsequent formation of a gate structure. The through grooves 270 are in communication with the gate opening 260, so that after the through grooves 270 and the gate opening 260 are subsequently filled with the gate structures, the gate structures can surround the channel layers 130.

The top surface and side walls of the initial dielectric wall 230 that are not in contact with the channel layers 130 are further exposed from the through grooves 270 and the gate opening 260, so that the exposed initial dielectric wall 230 can be subsequently etched.

The sacrificial layers 220 are removed after the source/drain doped layers 160 are formed. Therefore, after the sacrificial layers 220 are removed, two ends of the channel layers 130 are connected to the source/drain doped layers 160 in the extension direction of the channel layers 130, and are suspended in the gate opening 260, so that the gate structures can surround the channel layers 130 subsequently.

In some implementations, after the sacrificial layers 220 are removed, one or more channel layers 130 spaced apart from each other are configured to form channel structure layers 120, and the channel structure layers 120 and the protruding portions 110 are spaced apart from each other.

In some implementations, the sacrificial layer 220 is removed using the vapor etching process. Specifically, a material of the channel layers 130 is Si, and a material of the sacrificial layers 220 is SiGe. Therefore, the sacrificial layers 220 exposed from the gate opening 260 are removed through HCl vapor.

Figure 16:
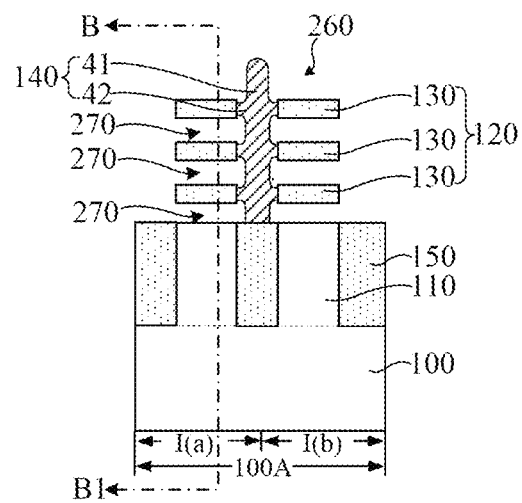

Referring to FIG. 16, isotropic etching processing is performed on the initial dielectric wall 230 to form a dielectric wall 140. The dielectric wall 140 includes a main dielectric wall portion 41 protruding from the substrate 100 and dielectric wall protrusions 42 protruding from the main dielectric wall portion 41 in a longitudinal direction. The dielectric wall protrusions 42 are in contact with the side walls of the channel layers 130.

Isotropic etching processing is performed on the initial dielectric wall 230 to form a dielectric wall 140, so that the dielectric wall 140 includes the main dielectric wall portion 41 and the dielectric wall protrusions 42. The dielectric wall protrusions 42 are in contact with the side walls of the channel layers 130. Compared with the solution in which the dielectric wall does not have the dielectric wall protrusions and has flush side walls, in some implementations, by forming the dielectric wall protrusions 42, the dielectric wall protrusions 42 are easier to deform when subjected to stress, which facilitates a reduction in the resistance of the dielectric wall 140 to the stress in the channel layers 130, correspondingly reducing the influence of the dielectric wall 140 on the stress applied by the source/drain doped layers 160 to the channel layers 130, thereby helping to increase carrier mobility in the channel layers 130, and improving the performance of the semiconductor structure.

In some implementations, bottom walls of the dielectric wall protrusions 42 are retracted relative to bottom walls of the channel layers 130, and top walls of the dielectric wall protrusions 42 is retracted relative to top walls of the channel layers 130. Therefore, top corners and bottom corners of the channel layers 130 close to the dielectric wall 140 can be exposed from the dielectric wall 140, thereby reducing a contact area between the dielectric wall 140 and the channel layers 130. The source/drain doped layers 160 are configured to apply a stress to the channel layers 130 to increase the carrier mobility in the channel region. The contact area between the dielectric wall 140 and the channel layers 130 is reduced, which correspondingly further reduces the hindering effect of the dielectric wall 140 on the stress in the channel layers 130, and reduces the influence of the dielectric wall 140 on the stress applied by the source/drain doped layers 160 to the channel layers 130, thereby helping to increase carrier mobility in the channel layers 130 and optimizing the performance of the semiconductor structure. In some implementations, the dielectric wall 140 is formed by performing isotropic etching processing on the initial dielectric wall 230. Therefore, the dielectric wall 140 is integrally formed.

It is to be noted that the bottom walls of the dielectric wall protrusions 42 are retracted relative to bottom walls of the channel layers 130, or top walls of the dielectric wall protrusions 42 are retracted relative to top walls of the channel layers 130 by a first retraction size. The first retraction size should not be excessively small or excessively large. If the bottom walls of the dielectric wall protrusions 42 are retracted relative to the bottom walls of the channel layers 130 by an excessively small size, the effect of reducing the contact area between the channel layers 130 and the dielectric wall 140 is not obvious. If the bottom walls of the dielectric wall protrusions 42 are retracted relative to the bottom walls of the channel layers 130 by an excessively large size, the contact area between the dielectric wall protrusions 42 and the channel layers 130 is excessively small, which is easy to increase process risks. In some implementations, the first retraction size is 7.5 nm to 15 nm. For example, the first retraction size is 8 nanometers, 9 nanometers, 10 nanometers, and the like.

It is to be further noted that, in the longitudinal direction, a single side wall of the main dielectric wall portion 41 is retracted relative to side walls of the dielectric wall protrusions 42 on the same side by a second retraction size. The second retraction size should not be excessively small or excessively large. If the second retraction size is excessively small, the first retraction size is likely to be excessively small, and it is also easy to cause an exposed area of corners at end portions of the channel layers 130 close to the dielectric wall 140 to be excessively small, causing difficulty in subsequent rounding processing on corners of the channel layers 130. To this end, in some implementations, in the longitudinal direction, the single side wall of the main dielectric wall portion 41 is retracted relative to the side walls of the dielectric wall protrusions 42 on the same side by 7.5 nanometers to 15 nanometers.

In some implementations, the foregoing step of removing the sacrificial layers 220 includes: performing main etching processing on the sacrificial layers 220; and after the performing main etching processing, performing over etching processing on the sacrificial layers 220.

During the over etching processing on the sacrificial layers 220, isotropic etching processing is performed on the initial dielectric wall 230 to form the dielectric wall 140, thereby performing isotropic etching processing on the initial dielectric wall 230 by using a process of removing the sacrificial layers 220, which can facilitate improvement of process integration and process compatibility, further facilitate simplification of the process, save costs, and improve production efficiency.

Specifically, the sacrificial layers 220 are over-etched by using a vapor etching process, and the vapor etching process is an isotropic etching process, so that isotropic etching processing can be performed on the initial dielectric wall 230.

In other implementations, the step of performing isotropic etching processing on the initial dielectric wall may further be performed separately. The isotropic etching processing includes an isotropic plasma etching process. The isotropic etching processing may further include a wet etching process.

Figure 17:
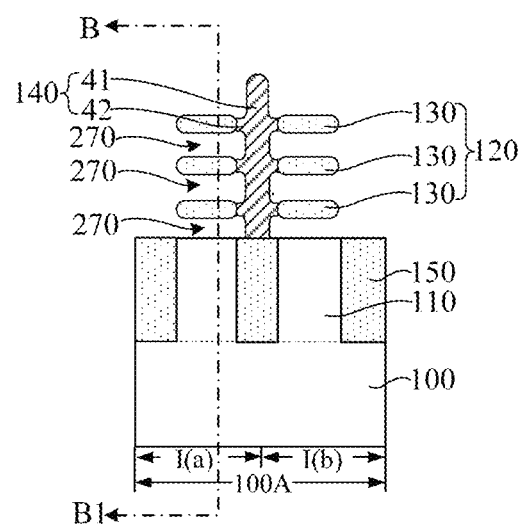

Referring to FIG. 17, optionally, the method for forming a semiconductor structure further includes: after the performing the isotropic etching processing on the initial dielectric wall 230, performing rounding processing on corners of the channel layers 130 exposed from the gate opening 260 and the through grooves 270, so that corners of the channel layers 130 are arc-shaped.

Rounding processing is performed on corners of the channel layers 130, so that corners of the channel layers 130 are arc-shaped, that is, top corners and bottom corners of the channel layers 130 exposed from the gate opening 260 and the through grooves 270 are round corners. Therefore, thicknesses of end portions of the channel layers 130 in the longitudinal direction are correspondingly less than thicknesses of middle positions of the channel layers 130, so that a size of the channel layer 130 in contact with the dielectric wall 140 is less than the maximum thickness of the channel layers 130, which can further reduce the hindering effect of the dielectric wall 140 on the stress in the channel layers 130, and reduce the influence of the dielectric wall 140 on a stress applied by the source/drain doped layers 160 to the channel layers 130, further increasing the carrier mobility in the channel layers 130.

In addition, the corners of the exposed channel layers 130 are arc-shaped. In other words, the exposed surfaces of the channel layers 130 is smooth surfaces. During subsequent formation of the gate structures surrounding the channel layers 130, it further facilitates improvement of thickness uniformity and film formation quality of the gate structures formed on the surfaces of the channel layers 130.

In other implementations, based on actual process requirements, the corners of the channel layers may not be arc-shaped, and the corners of the channel layers may be corners at right angles or other angles.

In some implementations, the performing rounding processing on corners of the channel layers 130 exposed from the gate opening 260 and the through grooves 270 includes: etching surfaces of the channel layers 130 exposed from the gate opening 260 and the through grooves 270 by adopting an isotropic plasma etching process, or performing annealing processing on the surfaces of the channel layers 130 exposed from the gate opening 260 and the through grooves 270 in a hydrogen atmosphere, or performing oxidation processing on the surfaces of the channel layers 130 exposed from the gate opening 260 and the through grooves 270.

The rate of etching sharp corners or corners by using the isotropic plasma etching process is greater than a rate of etching a flat surface, so that exposed corners of the channel layers 130 are etched at a faster rate during etching of the surface of the channel layers 130 exposed from the gate opening 260 and the through grooves 270 by using the isotropic plasma etching process, so that the exposed corners of the channel layers 130 are rounded.

In a hydrogen atmosphere, annealing processing is performed on the exposed surfaces of the channel layers 130, so that reflow may occur in the channel layers 130, and the exposed corners of the channel layers 130 are softened to form rounded corners. Specifically, hydrogen can break a silicon-silicon bond, so that the channel layers 130 are softened.

During oxidization processing of the surfaces of the channel layers 130 exposed from the gate opening 260 and the through grooves 270, an oxidation rate at the corner is greater than an oxidation rate on the flat surface, so that the exposed corners of the channel layers 130 easily become rounded corners. Specifically, the oxidation processing may be thermal oxidation processing. When the rounding processing on corners includes oxidation processing, after the oxidation processing is performed, oxides on the surfaces of the channel layers 130 usually need to be removed.

Figure 18:
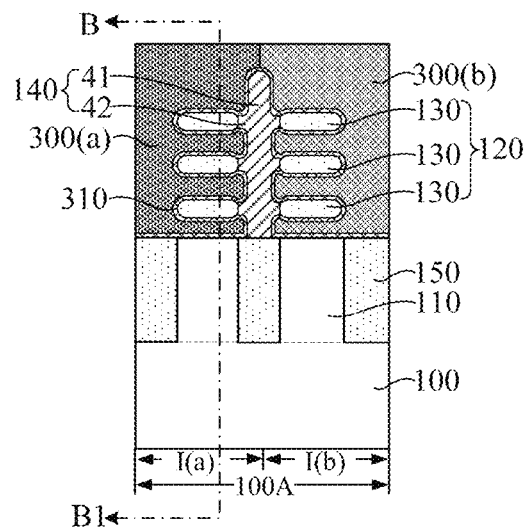
Figure 19:
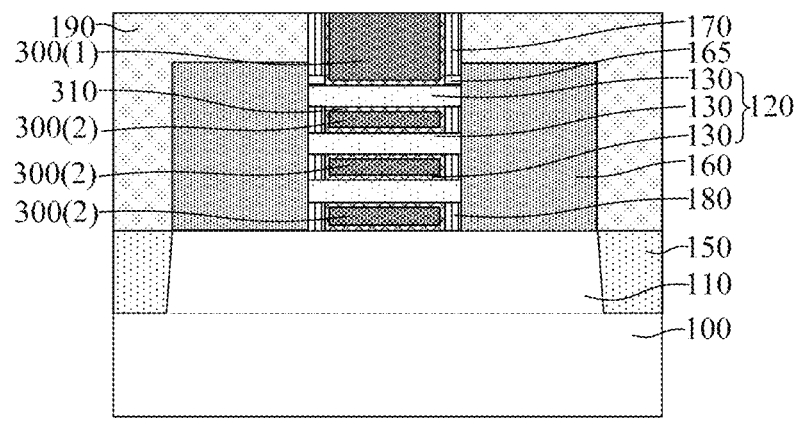

Referring to FIG. 18 and FIG. 19, gate structures 300 are formed in the gate opening 260 and the through grooves 270 of the sub-device regions I after the dielectric wall 140 is formed.

The gate structure 300 located on each of the sub-device regions I is configured to control opening and closing of conductive channels of the corresponding sub-device region I.

As an example, the device unit region 100A includes a first sub-device region I(a) and a second sub-device region I(b), where the portion of the gate structure 300 located on the first sub-device region I(a) serves as a first gate structure 300(a), and the portion of the gate structure 300 located on the second sub-device region I(b) serves as a second gate structure 300(b).

The first gate structure 300(a) is configured to control opening and closing of conductive channels of the first sub-device region I(a), and the second gate structure 300(b) is configured to control opening and closing of conductive channels of the second sub-device region I(b).

In some implementations, the gate structure 300 is a metal gate structure. A material of the gate structures 300 includes at least one of TiN, TaN, Ti, Ta, TiAL, TiALC, TiSiN, W, Co, Al, Cu, Ag, Au, Pt, or Ni.

The gate structure 300 may include a work function layer (not shown) and a gate electrode layer (not shown) located on the work function layer. The work function layer may be filled or unfilled between adjacent channel layers 130 or between the protruding portions 110 and adjacent channel layers 130.

In some implementations, the transistor of the first type is a PMOS transistor, and the first gate structure 300(a) includes a first work function layer. The transistor of the second type is an NMOS transistor, and the second gate structure 300(b) includes a second work function layer.

The work function layer is configured to adjust a work unction of the transistor. Correspondingly, a material of the first work function layer is a P-type work function material, and a material of the second work function layer is an N-type work function material.

In some implementations, the materials of the first work function layer and the second work function layer are different. The dielectric wall 140 is disposed to prevent the steps of forming the first work function layer and the second work function layer from affecting each other during the formation of the first gate structure 300(a) and the second gate structure 300(b), thereby improving integrity of the first gate structure 300(a) and the second gate structure 300(b), and improving the performance of the semiconductor structure.

The gate electrode layer serves as an electrode for implementing an electrical connection between the gate structure 300 and an external circuit or other interconnection structures. In some implementations, materials of gate electrode layers of the first gate structure 300(a) and the second gate structure 300(b) are the same, since the gate electrode layers of the first gate structure 300(a) and the second gate structure 300(b) are formed in the same step after the first work function layer and the second work function layer are formed.

In some implementations, a metal gate structure, for example, is used as the gate structure 300. In other implementations, based on actual process requirements, the gate structures may be other types of gate structures such as a polysilicon gate structure or an amorphous silicon gate structure.

In some implementations, the gate structures 300 between adjacent sub-device regions I in the longitudinal direction are in contact with each other on a top of the dielectric wall 140, so that the gate structures 300 between adjacent sub-device regions I can be electrically connected, so that the transistors in adjacent sub-device regions I can be used in conjunction.

In some implementations, the first gate structure 300(a) and the second gate structure 300(b) are in contact with each other on the top of the dielectric wall 140.

In some implementations, in a transverse direction, side walls of the gate structures 300 are retracted relative to side walls of the channel layers 130 on the same side, parts of the gate structures 300 that span the channel structure layers 120 serve as first parts 300(1), and parts of the gate structures 300 that are located between adjacent channel layers 130 or between the protruding portions and the channel layers 130 adjacent to the protruding portions 110 serve as second parts 300(2).

In some implementations, after the dielectric wall 140 is formed and before the gate structures 300 are formed, the method for forming a semiconductor structure further includes: forming gate dielectric layers 310 on a bottom and side walls of the gate opening 260, on a top surface and side walls of the dielectric wall 140, and on surfaces of the channel layers 130 exposed from the dielectric wall 140.

The gate dielectric layer 310 is configured to electrically isolate the gate structure 300 from the channels. A material of the gate dielectric layers 310 includes at least one of silicon oxide, nitrogen-doped silicon oxide, $HfO_2$, $ZrO_2$, HfSiO, HfSiON, HfTaO, HfTiO, HfZrO, $La_2O_3$, or $Al_2O_3$.

The gate dielectric layer 310 may be a gate oxide layer or a high-k gate dielectric layer; or the gate dielectric layer 310 includes a gate oxide layer and a high-k gate dielectric layer located on the gate oxide layer.

A material of the gate oxide layer may be silicon oxide or silicon oxynitride. The material of the high-k gate dielectric layer is a high-k dielectric material. The material of the high-k gate dielectric layer may be selected from $HfO_2$, $ZrO_2$, HfSiO, HfSiON, HfTaO, HfTiO, HfZrO or $Al_2O_3$.

In some implementations, the gate dielectric layer 310 is a high-k dielectric layer.

Although the present disclosure is described above, the present disclosure is not limited thereto. Any person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
   a substrate comprising a discrete device unit region, wherein the device unit region comprises a plurality of sub-device regions arranged in a longitudinal direction;
   protruding portions protruding from the substrate in the sub-device regions of the plurality of sub-device regions and extending in a transverse direction;
   channel structure layers located on the protruding portions and spaced apart from the protruding portions, wherein each of the channel structure layers comprises one or more channel layers spaced apart from each other in sequence from a bottom to a top;
   a dielectric wall located on the substrate between adjacent sub-device regions in the longitudinal direction, wherein the dielectric wall comprises a main dielectric wall portion protruding from the substrate and dielectric wall protrusions protruding from the main dielectric wall portion in the longitudinal direction, wherein the dielectric wall protrusions are in contact with side walls of the channel layers, thicknesses of end portions of the channel layers are less than thicknesses of middle portions of the channel layers;

gate structures located on the sub-device regions, the gate structures spanning tops of the channel structure layers in the sub-device regions of the plurality of sub-device regions, and surrounding the channel layers exposed from the dielectric wall; and source/drain doped layers located on the protruding portions on two sides of the gate structures and in contact with the channel structure layers.

2. The semiconductor structure according to claim 1, wherein:
a material of the substrate comprises at least one of monocrystalline silicon, germanium, silicon germanium, silicon carbide, gallium nitride, gallium arsenide, or indium gallium;
a material of the protruding portions comprises at least one of monocrystalline silicon, germanium, silicon germanium, silicon carbide, gallium nitride, gallium arsenide, or indium gallium;
a material of the channel layers comprises at least one of monocrystalline silicon, germanium, silicon germanium, silicon carbide, gallium nitride, gallium arsenide, or indium gallium; and
a material of the dielectric wall comprises at least one of silicon nitride, silicon oxynitride, silicon carbide, silicon carboxynitride, silicon carbonitride, or silicon carboboronitride.

3. The semiconductor structure according to claim 1, further comprising:
isolation structures located on the substrate on sides of the protruding portions,
wherein in the longitudinal direction, the dielectric wall is located on an isolation structure between adjacent channel structure layers.

4. The semiconductor structure according to claim 1, wherein:
in the transverse direction, parts of the gate structures that span over the channel structure layers serve as first parts, and parts of the gate structures that are located between adjacent channel layers or between the protruding portions and channel layers adjacent to the protruding portions serve as second parts,
the semiconductor structure further comprises gate side walls located on side walls of the first parts and inner side walls located between second parts and the source/drain doped layers in the transverse direction,
the source/drain doped layers are located on the protruding portions on two sides of the gate structures and the gate side walls, and the semiconductor structure further comprises interlayer dielectric layers located on the substrate on sides of the gate structures and covering the source/drain doped layers.

5. The semiconductor structure according to claim 1, wherein:
bottom walls of the dielectric wall protrusions are higher than bottom walls of the channel layers, and
top walls of the dielectric wall protrusions are lower than top walls of the channel layers.

6. The semiconductor structure according to claim 5, wherein:
the bottom walls of the dielectric wall protrusions are higher than the bottom walls of the channel layers by 7.5 nanometers to 15 nanometers,
the top walls of the dielectric wall protrusions are lower than the top walls of the channel layers by 7.5 nanometers to 15, and
a single side wall of the main dielectric wall portion is retracted relative to the side walls of the dielectric wall protrusions on the same side by 7.5 nanometers to 15 nanometers.

7. The semiconductor structure according to claim 1, wherein the main dielectric wall portion and the dielectric wall protrusions are integrally formed.

8. The semiconductor structure according to claim 1, further comprising:
gate dielectric layers located between surfaces of the channel layers and the gate structures and between the dielectric wall and the gate structures,
wherein a material of the gate dielectric layers comprises at least one of silicon oxide, nitrogen-doped silicon oxide, $HfO_2$, $ZrO_2$, HfSiO, HfSiON, HfTaO, HfTiO, HfZrO, $La_2O_3$, or $Al_2O_3$, and
wherein a material of the gate structures comprises at least one of TiN, TaN, Ti, Ta, TiAL, TiALC, TiSiN, W, Co, Al, Cu, Ag, Au, Pt, or Ni.

9. The semiconductor structure according to claim 1, wherein:
the device unit region comprises a first sub-device region and a second sub-device region arranged in the longitudinal direction,
the first sub-device region is configured to form a transistor of a first type,
the second sub-device region is configured to form a transistor of a second type, and
channels of the transistor of the second type and channels of the transistor of the first type have different conductivity types.

10. The semiconductor structure according to claim 1, wherein in the longitudinal direction, the gate structures on the adjacent sub-device regions are in contact with each other on a top of the dielectric wall.

* * * * *